(12) United States Patent
Oda et al.

(10) Patent No.: US 7,049,176 B2
(45) Date of Patent: May 23, 2006

(54) METHOD OF FORMING THICK-FILM WIRING AND METHOD OF PRODUCING LAMINATED ELECTRONIC COMPONENT

(75) Inventors: Tetsuya Oda, Shiga-ken (JP); Choichiro Fujii, Takefu (JP); Etsuo Nishikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/724,803

(22) Filed: Dec. 1, 2003

(65) Prior Publication Data

US 2004/0110321 A1  Jun. 10, 2004

(30) Foreign Application Priority Data

Dec. 5, 2002 (JP) .............................. 2002-353772
Oct. 14, 2003 (JP) .............................. 2003-353100

(51) Int. Cl.
  *H01L 21/44* (2006.01)
  *B41M 1/10* (2006.01)
  *H01R 13/10* (2006.01)

(52) U.S. Cl. ...................... 438/119; 101/170; 439/632; 439/876

(58) Field of Classification Search ................ 438/125, 438/119; 439/876, 632, 541.5, 329, 682; 29/739; 101/170
See application file for complete search history.

(56) References Cited

U.S. PATENT DOCUMENTS 5,366,760 A * 11/1994 Fujii et al. ................. 427/98.4
5,514,503 A    5/1996 Evans et al.
5,853,446 A * 12/1998 Carre et al. ................. 65/17.3
6,114,404 A *  9/2000 Deeken et al. ............... 522/88
6,152,033 A * 11/2000 Eid et al. ..................... 101/170
6,732,643 B1 *  5/2004 Kwon et al. .................. 101/170
2001/0037738 A1* 11/2001 Kinoshita ...................... 101/170
2002/0017864 A1*  2/2002 Watanabe et al. ........... 313/586
2002/0043523 A1*  4/2002 Fujita et al. ................. 219/216
2003/0091751 A1*  5/2003 Tsuruta et al. ............... 427/487

FOREIGN PATENT DOCUMENTS

JP     7-169635    7/1995
JP     11-154782   6/1999

OTHER PUBLICATIONS

Korean Official Communication issued on Sep. 21, 2005 in the corresponding Korean Application No. 10-2003-0085026. (With full English translation).

* cited by examiner

*Primary Examiner*—W. David Coleman
(74) *Attorney, Agent, or Firm*—Keating & Bennett (57) ABSTRACT

In a method of forming a thick-film wiring on a substrate, photosensitive-electroconductive paste is filled into a pattern groove formed on the surface of a light-transmitting intaglio plate. The pattern groove corresponds to a desired thick-film wiring pattern. The photosensitive-electroconductive paste filled in the pattern groove are irradiated with light-rays from the front and back sides of the intaglio plate to cause the paste to harden until the overall peripheral surface of the electroconductive paste has a predetermined hardness. The electroconductive paste hardened in the pattern grooves of the intaglio plate is transferred to an intermediate piece. Then, the electroconductive paste is transferred from the intermediate piece to a substrate. Thereafter, the electroconductive paste is fired, whereby a thick-film wiring is formed on the substrate.

19 Claims, 11 Drawing Sheets

METHOD OF FORMING THICK-FILM WIRING AND METHOD OF PRODUCING LAMINATED ELECTRONIC COMPONENT

BACKGROUND OF THE INVENTION

1. Field of the Invention

The present invention relates to a method of forming a thick-film wiring, and more particularly, to a method of forming on a substrate a thick-film wiring having a fine line-width and a relatively large film-thickness, e.g., at least about 10 µm.

2. Description of the Related Art

In recent years, with the sizes of electronic devices being reduced, the reduction in size of electronic components used in the electronic devices has been required. In these situations, thick-film wirings are needed because the wiring pattern is fine and the line resistances of the wiring pattern are reduced.

To satisfy the above-described requirements, as proposed in Japanese Patent No. 3039265, electroconductive paste is filled in the engraved portions of an intaglio plate made of a flexible resin. The paste is dried. Then, additional electroconductive paste is added to the engraved portions of the flexible resin intaglio plate to compensate for the reduction in volume of the electroconductive paste caused by the drying. Thereafter, the electroconductive paste is dried. The process in which additional electroconductive paste is added and, then, dried is repeated several times. An adhesive layer is formed on a substrate. The intaglio plate and the substrate are bonded to each other so that the electroconductive paste is transferred onto the substrate. The electroconductive paste is fired to produce a thick-film wiring.

However, according to this method, it is necessary to repeat the filling of the electroconductive paste and the drying several times. Thus, because the number of processing steps is large, the processing time is long.

Japanese Unexamined Patent Application Publication No. 11-154782 proposes a method of forming a thick-film wiring on a substrate. Electroconductive paste which contains metallic powder and which is a light-sensitive-hardening type of paste is filled in the grooves of a transparent intaglio plate. The electroconductive paste is irradiated with UV rays from the back side of the intaglio plate while the electroconductive paste is in contact with a substrate. Thus, the light-sensitive hardening-reaction of the paste is caused, the electroconductive paste is hardened, and the electroconductive paste is bonded to the substrate. Thereafter, the intaglio plate is separated from the substrate. Thus, the hardened electroconductive paste is transferred to the substrate. Thereafter, the electroconductive paste is fired.

According to the above-described method, it is not necessary to repeat the filling of additional electroconductive paste and the drying of the electroconductive paste. Advantageously, the number of process steps can be reduced.

Figure 11A:
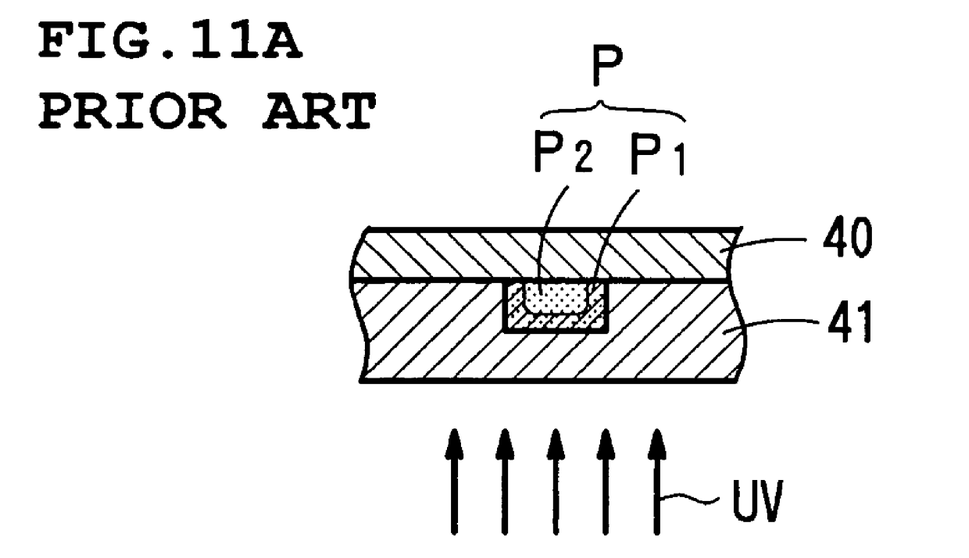
FIGS. 11A and 11B are cross-sectional views of a conventional method of forming a thick-film wiring.
Figure 11B:
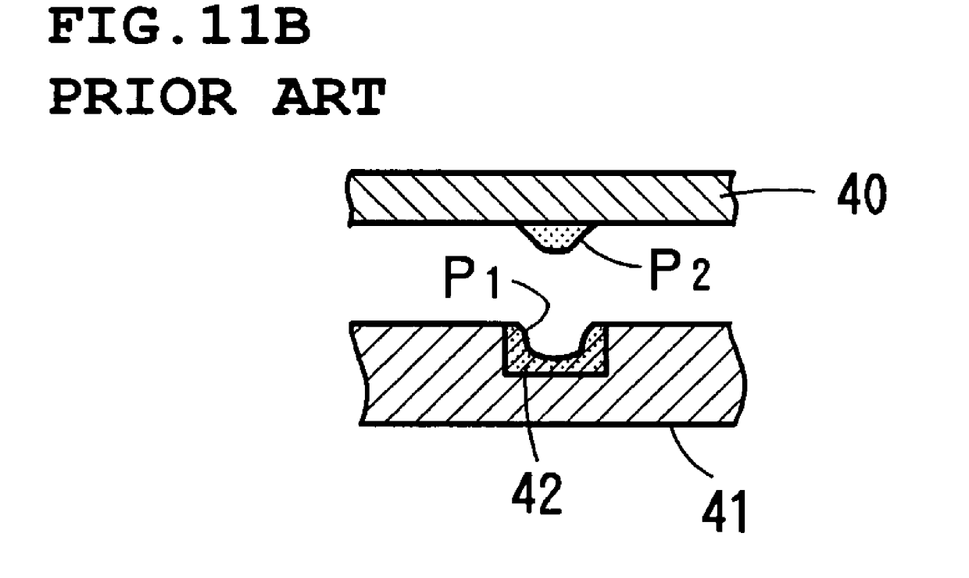

However, as illustrated in FIG. 11A, when the thick-film made of the electroconductive paste has a thickness of at least 20 µm, ultraviolet rays UV cannot reach the innermost part of the electroconductive paste P. Thus, the part of the paste P which is in contact with the groove 42 of the transparent intaglio plate 41 is hardened to form a hardened part P1. The part of the electroconductive paste P which is in contact with a substrate 40 is not hardened to form an un-hardened part P2. Therefore, when the substrate 40 is separated from the intaglio plate 41, a part of the electroconductive paste P remains in the groove 42. Thus, a transfer deficiency occurs as shown in FIG. 11B.

Thus, conventional thick-film wirings are formed with much difficulty.

SUMMARY OF THE INVENTION

To overcome the problems described above, preferred embodiments of the present invention provide a method of forming a thick-film wiring in which an electroconductive paste can be securely transferred from an intaglio plate onto a substrate, even if the electroconductive paste is thicker than a predetermined thickness.

According to a preferred embodiment of the present invention, a method of forming a thick-film wiring on a substrate includes a first step of filling photosensitive-electroconductive paste into a pattern groove formed on the surface of a light-transmissive intaglio plate, the pattern groove corresponding to a desired thick-film wiring pattern, a second step of irradiating the photosensitive-electroconductive paste filled in the pattern groove with light-rays from the front and back sides of the intaglio plate to cause the paste to harden until the overall peripheral surface of the electroconductive paste has a predetermined hardness, a third step of transferring the electroconductive paste hardened in the intaglio plate to the substrate directly or via an intermediate piece, and a fourth step of firing the electroconductive paste, whereby a thick-film wiring is formed on the substrate.

A method of transferring an electroconductive paste directly from an intaglio plate to a substrate will be described. First, a photosensitive-electroconductive paste is filled into a pattern groove formed on the surface of a light-transmissive intaglio plate. The filling can be easily performed by supplying the electroconductive paste onto the surface of the intaglio plate and scraping off excess electroconductive paste by means of a squeegee or other suitable means.

Subsequently, light irradiates the photosensitive-electroconductive paste filled in the pattern groove from the front and back sides of the intaglio plate. Thus, the photosensitive-electroconductive paste is caused to harden so that the overall surface of the electroconductive paste is hardened to a predetermined hardness. The light may include ultraviolet light, visible light, and infrared light. For example, in the case in which the electroconductive paste is UV-ray curable, UV rays are irradiated from the front and back sides of the intaglio plate so that the part of the photosensitive-electroconductive paste exposed to the surface of the intaglio plate is directly irradiated by the UV rays and the part of the photosensitive-electroconductive paste which is in contact with the groove of the intaglio plate is irradiated by the UV rays transmitted through the intaglio plate. Metallic powder, an organic binder, a photopolymerization initiator, a light-curable monomer, and other suitable materials are contained in the electroconductive paste. However, because UV rays irradiate the front and back sides of the intaglio plate, the overall surface of the photosensitive-electroconductive paste is hardened to a predetermined hardness. Thus, the cohesive force is increased. Accordingly, defects in the transferring, such as the photosensitive-electroconductive paste remaining in the groove according to the conventional techniques, are prevented.

Subsequently, the electroconductive paste hardened in the intaglio plate is transferred to the substrate. In particular, the substrate is pressed against the surface of the intaglio plate, so that a tacky-adhesive force is developed between the photosensitive-electroconductive paste and the substrate. The photosensitive-electroconductive paste is transferred onto the surface of the substrate because of the tacky-adhesive force. The tacky-adhesive force or adhesive force between the photosensitive-electroconductive paste and the substrate is preferably higher than the tacky-adhesive force or adhesive force between the photosensitive-electroconductive paste and the intaglio plate. Thereby, a part of the photosensitive-electroconductive paste is prevented from remaining in the groove. Defects in the transferring are eliminated.

After the photosensitive-electroconductive paste is transferred to the substrate, the photosensitive-electroconductive paste is fired. Thus, a thick-film wiring is formed on the substrate. For example, the thick-film wiring can be formed by placing the substrate in a firing oven and integrally firing.

As described above, light is irradiated from the front and back sides of the intaglio plate. Thereby, the overall surface of the photosensitive-electroconductive paste filled in the intaglio plate can be hardened to a predetermined hardness. Thus, the transferring-performance is improved. Therefore, even if the thickness of the photosensitive-electroconductive paste is about 20 μm or larger, defects in the transferring are eliminated.

Preferably, the intaglio plate is made of a transparent PET film.

A light-transmissive intaglio plate made of glass may also be used. However, the intaglio plate made of glass cannot be bent when the photosensitive-electroconductive paste is released from the substrate. Thus, the releasing property is inferior. Moreover, the fine-groove formation of the intaglio plate made of glass is carried out by etching. But, the depth of a groove formed by etching is less than about 2 μm. Thus, a deep groove cannot be formed by etching.

Thus, the intaglio plate is preferably formed of a transparent PET film. The intaglio plate can be bent during the releasing, the groove can be sufficiently processed, and the intaglio plate is inexpensive.

Polyimide may be used as the resin material for the intaglio plate. However, the UV-ray transmittance of the polyimide is low, about 60%. In contrast, the UV-ray transmittance of the PET film is preferably at least about 90%. Thus, the hardening-reaction of the photosensitive-electroconductive paste is effectively created.

Preferably, the intaglio plate is made of a PET film, and in the second step, light rays having a wavelength of at least about 350 nm irradiate the photosensitive-electroconductive paste from the front and backsides of the intaglio plate.

In the case in which the intaglio plate made of a resin film is used, the intaglio plate may be deteriorated by light. The PET film exhibits a light-wavelength versus absorption spectrum shown in FIG. 8. The PET film tends to absorb waves having a relatively short wavelength of about 300 nm or less in the UV ray spectrum. When UV rays are continuously irradiated in the second step, the intaglio plate absorbs the light, so that the intaglio plate is further deteriorated. Thus, for irradiation of UV rays, a wavelength cut-off filter (e.g., a wavelength—cut-off material coated onto a glass plate) is used so that the UV rays having a wavelength of about 350 nm or less are cut off. Thus, the durability of the intaglio plate is enhanced.

Figure 9:
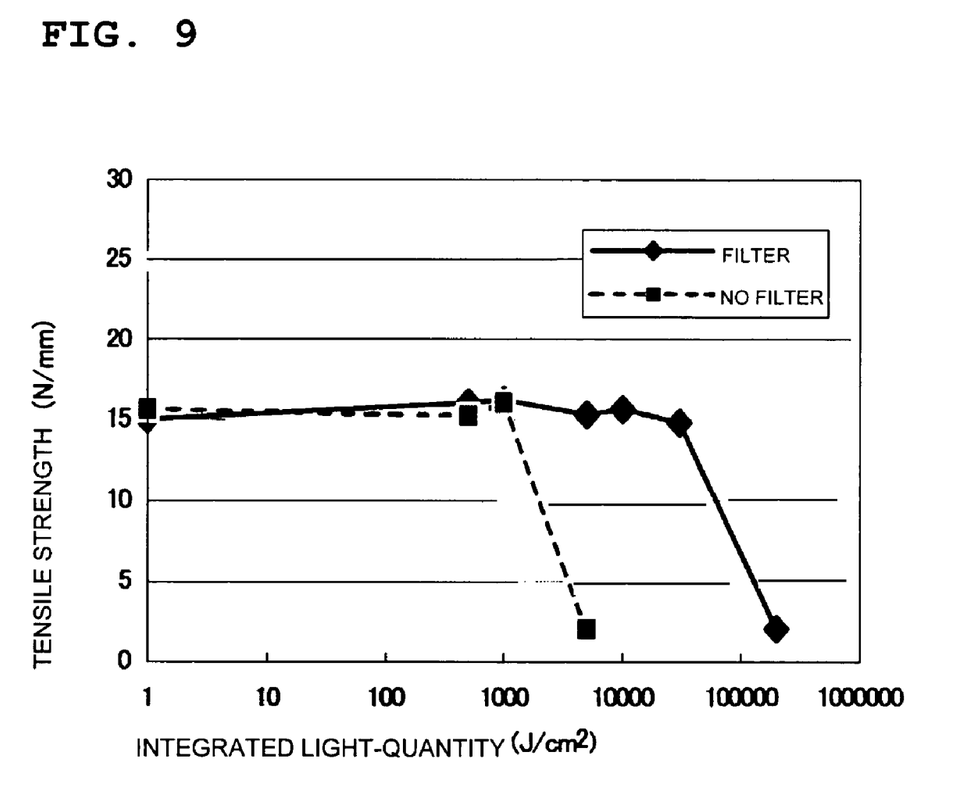
FIG. 9 is a graph illustrating the relationship between the integrated quantity of UV rays of the PET film and the tensile strength thereof.

FIG. 9 shows a relationship between the integrated light-quantity of UV rays irradiated on the PET film and the tensile strength thereof. In the case in which no filter is used and the integrated light-quantity is less or equal to 5000 J/cm$^2$, the tensile strength of the PET film is reduced substantially to zero. In the case in which the filter is used, the tensile strength can be maintained at about 85000 J/cm$^2$.

Preferably, the intaglio plate is made of a transparent PET film, and the pattern groove of the intaglio plate is formed with a laser beam having a wavelength shorter than that of the above-described light. The intaglio plate exhibits a wavelength-light-transmittance spectrum which shows that the transmittance of the intaglio plate for a laser beam is low and that for the above-described light is high.

If the PET film is grooved with a laser beam, a deep groove can be easily formed. Thus, the grooving with a laser beam is desirable. However, because the PET film has the above described light-wavelength versus absorption spectrum, the light-transmittance of the PET film for UV rays in a wavelength range with which the hardening reaction of the paste occurs is high and the processing-property with a laser beam is superior.

Figure 8:
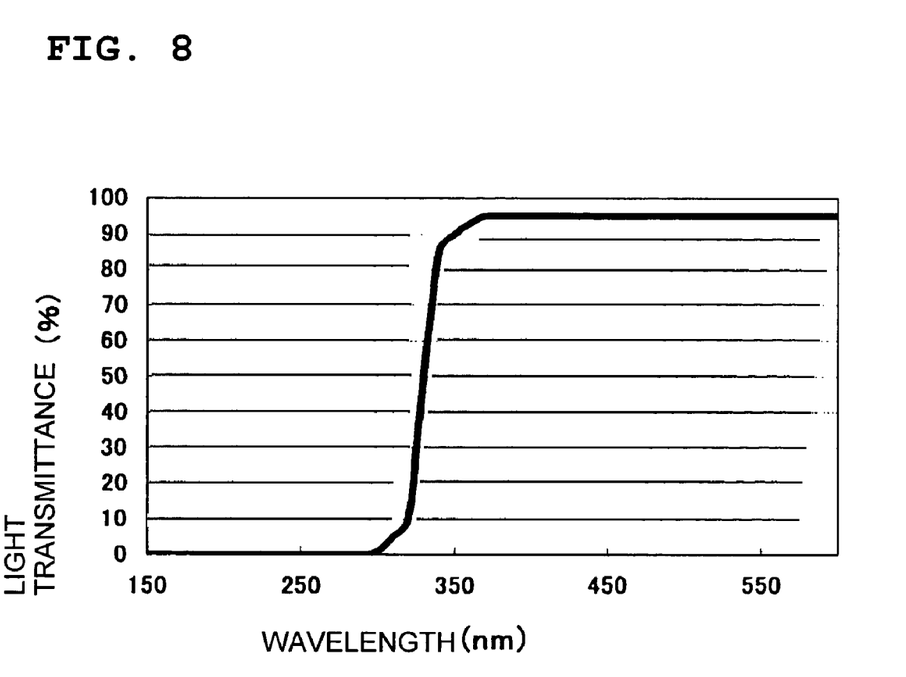
FIG. 8 is a light-wavelength versus absorption spectrum of a PET film.

For the PET film, the light-transmittance in the vicinity of about 320 nm is rapidly changed as shown in FIG. 8. Therefore, if an excimer laser with a wavelength of about 190 nm to about 250 nm is used for processing, the laser beam is substantially completely absorbed. Thus, the PET film can be satisfactorily processed. The groove having a desired depth (at least about 20 μm) can be formed in a short time.

As described above, the light-transmittance of the PET film for UV rays is superior. The durability of the intaglio plate is enhanced.

The photosensitive-electroconductive paste may be transferred in two steps, i.e., from the intaglio plate to the intermediate piece and then from the intermediate piece to the substrate. Thus, the intermediate piece is preferably made of a light-transmissive material. The second step includes irradiating light from the back side of the intaglio plate and also from the back side of the intermediate piece while the intermediate piece and the intaglio plate, which has the photosensitive-electroconductive paste filled or coated thereon, contact each other. The third step includes transferring the electroconductive paste hardened in the intaglio plate to the intermediate piece, and then, transferring the electroconductive paste from the intermediate piece to the substrate.

When the photosensitive-electroconductive paste P is filled into the groove of the intaglio plate, residual paste may be formed on the surface of the intaglio plate after the scraping-off. According to the method of transferring the paste from the intaglio plate directly to the substrate, the residual paste may be transferred together with the paste filled in the groove. When the method of indirectly transferring the paste to the substrate via the intermediate piece is used, the residual paste is not transferred to the substrate, although the residual paste is transferred to the intermediate piece, because the film-thickness of the residual paste is very small. Thus, a clean conductor pattern without residual paste on the surfaces of the substrate can be provided.

Preferably, in the second step, the quantity of light irradiated from the front side of the intaglio plate is larger than the quantity of light irradiated from the back side thereof.

To enhance the transferring property of the photosensitive-electroconductive paste, a method of coating a release agent of fluororesin or other suitable material onto the surface of the intaglio plate (including the groove) in advance, a method of coating a tacky-adhesive or adhesive onto the surface of the substrate, a method of forming a groove having a trapezoidal cross-sectional shape including side walls with a predetermined tapering-angle may be used. Preferably, the above-described setting of the irradiation quantity is used independently of these methods or in addition to them.

Figure 10:
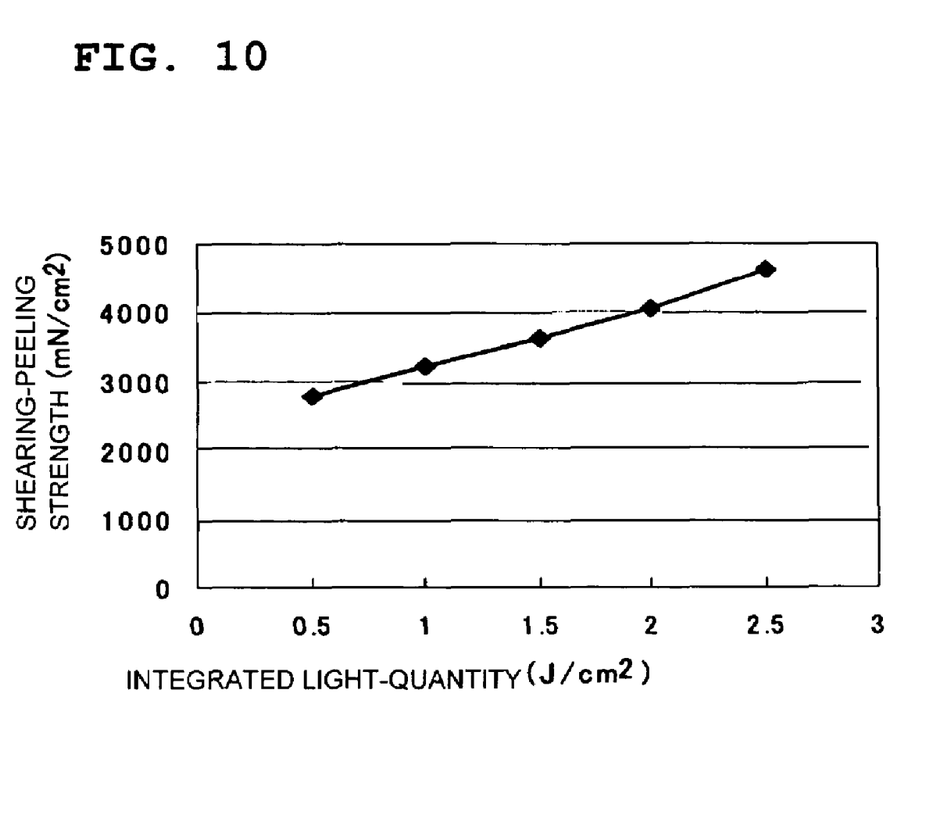
FIG. 10 is a graph illustrating the relationship between the integrated quantity of UV rays to the shear peeling strength between the electroconductive paste and the intaglio plate.

As shown in FIG. 10, when UV rays are used, the releasing property of the photosensitive-electroconductive paste released from the intaglio plate is changed with the integrated quantity of the UV rays. When the transparent intermediate piece contacts the intaglio plate, the UV rays are irradiated from both sides. The hardening is carried out under the condition that the adhesive force on the intermediate piece is high (the integrated light-quantity or the irradiation is increased), and the adhesive force on the intaglio plate side is small (the integrated light-quantity of the irradiation is decreased). Thereby, the photosensitive-electroconductive paste is easily transferred to the intermediate piece.

For this method, the light-intensity of the light source or the irradiation time is simply increased. Accordingly, the processing can be simply performed compared to the above-described methods.

Preferably, the intaglio plate is a flexible one made of resin, and the resin intaglio plate is bonded to a support which is light-transmissive and non-flexible.

For example, if the intaglio plate is made of a hard material such as glass or the like, the pattern groove is formed by ion etching or ion trimming. Accordingly, the processing cost is high. Especially, problems occur when a deep groove is formed. Wet etching which is relatively inexpensive is applied mainly for materials such as metals or the like which are not light-transmissive. Moreover, isotropic etching is carried out by using the wet etching. Thus, a groove having a high aspect ratio can be formed.

Moreover, a method of laser-processing a resin film made of PE, PC or suitable material to produce the intaglio plate may be used. However, in this case, the pattern is distorted because the intaglio plate is deformed when the photosensitive-electroconductive paste is transferred to the substrate. Thus, a precise conductor pattern cannot be obtained, and moreover, the intaglio plate is severely damaged. Thus, the deterioration is serious.

Thus, as described above, preferably, the resin intaglio plate which is easy processing is bonded to a support which is light-transmissive and non-flexible. Thereby, the above-described problems are solved. That is, light can be irradiated via the intaglio plate and the support, and thus, the photosensitive-electroconductive paste can be transferred without the intaglio plate being deformed. Thus, no distortion is generated, a precision conductor pattern can be provided, and the deterioration of the intaglio plate is reduced.

Preferably, a release agent is coated on the inner surface of the pattern groove of the intaglio plate.

When the release agent of fluororesin or other suitable material is coated in the inner surface of the pattern groove of the intaglio plate in advance, the transferring property of the electroconductive paste transferred from the intaglio plate to the substrate is improved. Even if the electroconductive paste is coated to have a large film-thickness of about 40 µm to about 60 µm, the photosensitive-electroconductive paste can be securely transferred from the intaglio plate to the substrate.

The method of forming a thick-film wiring may be applied to a method of producing a laminated electronic component. According to preferred embodiments of the present invention, a method of producing a laminated electronic component includes the steps of preparing a substrate made of a green sheet, transferring photosensitive-electroconductive paste onto the substrate directly or via an intermediate piece, repeating the above-described two steps so that plural substrates having the photosensitive-electroconductive paste transferred thereto are laminated to form a laminate, firing the laminate and the photosensitive-electroconductive paste simultaneously with each other. The photosensitive-electroconductive paste is formed by the above-described method of forming a thick-film wiring.

The photosensitive-electroconductive paste is transferred to the substrate. A predetermined number of laminated substrates are fired simultaneously with the photosensitive-electroconductive paste. In this case, the metallic powder included in the photosensitive-electroconductive paste is melted to form a thick-film wiring, and also, the substrate is converted to a ceramic multi-layer substrate. Thus, a laminated electronic component having a thick-film wiring inside thereof is provided.

The following methods of forming a laminate may be proposed. According to one of the methods, a photosensitive-electroconductive paste is transferred to a substrate, and another substrate having the photosensitive-electroconductive paste transferred thereto is laminated to the above-described substrate. Thus, the lamination is repeated to form a laminate. According to another method, photosensitive-electroconductive paste is transferred to a substrate, another substrate not having photosensitive-electroconductive paste transferred thereto is laminated thereto, the photosensitive-electroconductive paste is transferred to the another substrate, still another substrate having no photosensitive-electroconductive paste transferred thereto is laminated thereto, and the process is repeated. Either of these methods may be used.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the Drawings.

EXAMPLE 1

Figure 1:
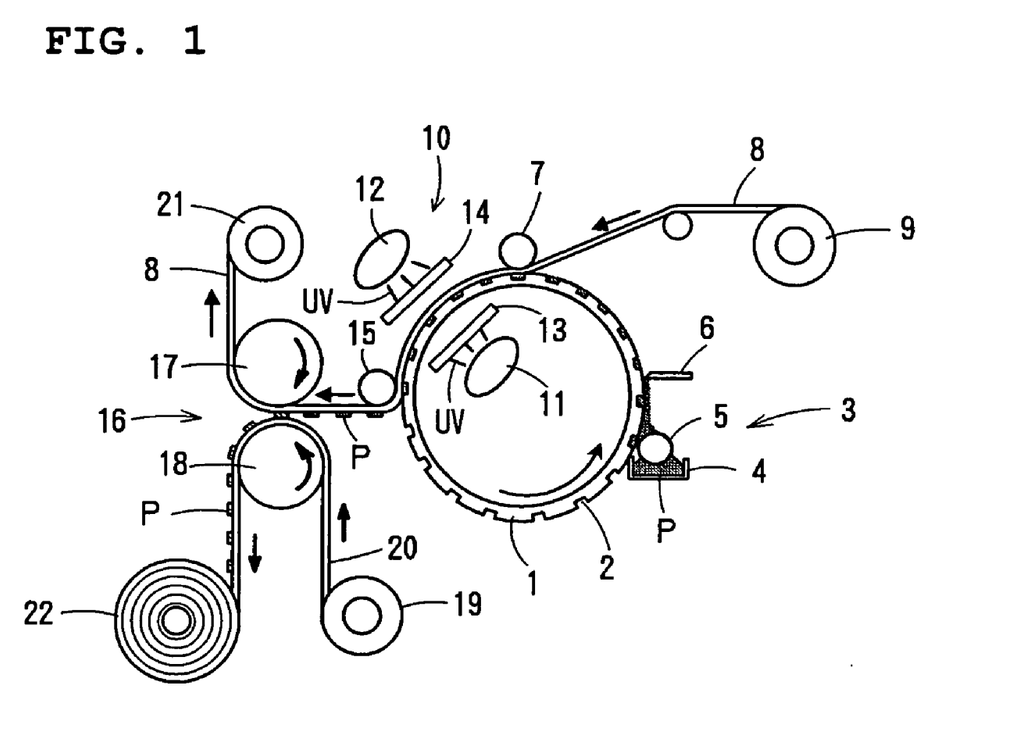
FIG. 1 illustrates a first transfer apparatus for use in a preferred embodiment of the present invention.

FIG. 1 illustrates a first transfer apparatus which carries out methods according to preferred embodiments of the present invention.

The transfer apparatus is provided with an intaglio plate 1 having a substantially cylindrical drum shape. The intaglio plate 1 is preferably made of a material having a UV transmittance such as transparent glass. A pattern groove 2 corresponding to a desired thick-film wiring pattern is formed on the outer surface of the intaglio plate 1. Preferably, the depth of the pattern groove 2 is at least about 20 μm, and the aspect ratio (longitudinal length/transverse length) is approximately 1. Preferably, the diameter of the intaglio plate 1 is in the range of about 300 mm to about 600 mm. The intaglio plate 1 is rotated at a constant speed in the direction shown by an arrow in FIG. 1.

A feeding unit 3 for supplying the electroconductive paste P to the pattern groove 2 is provided on the periphery of the intaglio plate 1. The electroconductive paste P includes metallic powder and reacts to UV rays irradiation by hardening. The electroconductive paste P may be a solvent type if the drying property thereof is high. However, the paste P of a non-solvent type is preferred because the volume of the paste is prevented from being reduced at drying. The feeding unit 3 includes a paste receptacle 4 in which the electroconductive paste P is stored, a coating roller 5 for coating the electroconductive paste P in the paste receptacle 4 onto the intaglio plate 1, and a squeegee 6 for scraping off the electroconductive paste P which is coated on the part of the coating roller 5 excluding the groove. Preferably, the squeegee 6 is made of a hard resin such as polyacetal or other suitable material. The electroconductive paste P can be completely filled into the pattern groove 2 by the squeegee 6.

The electroconductive paste P filled into the pattern groove 2 is moved to the position of the first roller 7 by the rotation of the intaglio plate 1. At the position of the first roller 7, a carrier sheet 8, which is continuously supplied from a feeding roller 9, contacts the intaglio plate 1. The carrier sheet 8 receives the electroconductive paste P from the intaglio plate 1 and transfers it to a substrate 20. That is, the carrier sheet 8 functions as an intermediate sheet. A sheet made of PET, PC, polyester, polystyrene, or other suitable material and having a certain UV-transmittance is preferably used as the carrier sheet 8.

The intaglio plate 1 and the carrier sheet 8 are rotated in contact with each other in the direction shown by an arrow. The intaglio plate 1 and the carrier sheet 8 are passed through an exposure unit 10, in which the electroconductive paste P is hardened. The exposure unit 10 includes a light source 11 for irradiating UV rays from the inner side of the intaglio plate 1 and a light source 12 for irradiating UV rays from the back side of the carrier sheet 8. Filters 13 and 14 absorb UV rays in a wavelength range that can be absorbed by the intaglio plate 1. As the light sources 11 and 12, high voltage mercury lamps, metal halide lamps, and other suitable light sources are used. UV rays are irradiated in such a manner that the exposures are in the range of about 0.2 J/cm² to about 1.0 J/cm². The UV intensity is preferably in the range of about 0.1 W/cm² to about 0.2 W/cm², the irradiation time is preferably in the range of about 1 second to about 10 seconds, and the rotational speed of the intaglio plate 1 is preferably about 2 rpm.

The carrier sheet 8 passed through the exposure unit 10 is released from the intaglio plate 1 by means of a second roller 15. When the electroconductive paste P hardens on the intaglio plate 1, an adhesive force is developed between the paste P and the carrier sheet 8. Thus, the electroconductive paste P is transferred onto the carrier sheet 8 by the second roller 15. A special pressing device is not required in the area from the first roller 7 to the second roller 15. With the tacky-adhesive force, the electroconductive paste P can be simply transferred to the carrier sheet 8.

Table 1 shows results of the transferring property and the shape of a conductor pattern for different exposures. The transferring property is expressed by the ratio at which, after the hardening reaction, the electroconductive paste is transferred from the intaglio plate to the substrate. The shape of a conductor pattern which is substantially conforms to the cross-sectional shape of the pattern groove 2 is expressed as "Very good", and one which significantly departs from the cross-sectional shape of the pattern groove 2 is expressed as "Inferior".

TABLE 1

| Exposure (J/cm²) | Transferring-property | Shape of conductor pattern |
| --- | --- | --- |
| 0.1 | Inferior | No data |
| 0.4 | Very good | Very good |
| 0.8 | Very good | Very good |
| 1.5 | Good | Good |
| 2.5 | Inferior | Inferior |

As seen in Table 1, a cohesive force with which the electroconductive paste P can be sufficiently transferred to the carrier sheet 8 is not generated when the exposure is in the range of up to approximately 0.1 J/cm². When the exposure is larger than about 2.5 J/cm², the electroconductive paste P sufficiently hardens. However, the bonding strength between the electroconductive paste and the intaglio plate 1 becomes excessively large, so that the releasing of the electroconductive paste P becomes insufficient. Accordingly, the exposure of light irradiated from the inner side of the intaglio plate 1 (from the back side of the electroconductive paste P) is preferably in the range of about 0.2 J/cm² to about 1.5 J/cm².

In Example 1, to improve the transferring from the intaglio plate 1 to the carrier sheet 8, the quantity of UV rays irradiated from the back side (from the front side of the electroconductive paste P) of the carrier sheet 8 is larger than the quantity of UV rays irradiated from the inner side (from the back side of the electroconductive paste P) of the intaglio plate 1. For example, the irradiation time of the light source 12 arranged on the back side of the carrier sheet 8 is preferably longer than the irradiation time of the light source 11 arranged in the inner periphery of the intaglio plate 1, or the UV ray intensity of the light source 12 is preferably larger than the UV ray intensity of the light source 11.

Thereby, the adhesive force of the electroconductive paste P on the carrier sheet 8 side is higher than the adhesive force of the electroconductive paste P on the groove side. Thus, the transferring of the paste P from the intaglio plate 1 to the carrier sheet 8 is improved.

Specifically, the quantity of UV rays irradiated from the inner side (from the back side of the electroconductive paste P) of the intaglio plate 1 may be in the range of about 0.2

J/cm² to about 1.5 J/cm². The quantity of UV rays irradiated from the back side (from the front side of the electroconductive paste P) of the carrier sheet 8 is preferably about 1.5 J/cm² or more.

The carrier sheet 8 having the electroconductive paste P passed under the second roller 15 is fed to a re-transferring unit 16. In the re-transferring unit 16, a pair of transferring rollers 17 and 18 is arranged. The substrate 20 and the carrier sheet 8 are contacted with and pressed against each other between the transferring rollers 17 and 18. Thus, the electroconductive paste P is re-transferred to the substrate 20. A ceramic green sheet lined with a carrier film is preferably used as the substrate 20. The substrate 20 is continuously supplied from a feeding roller 19. To improve the transferring of the electroconductive paste P from the carrier sheet 8 to the substrate 20, a compression load in the range of about 200 kg/cm to about 500 kg/cm² is preferably applied. Moreover, heaters or other suitable means may be provided inside the transferring rollers 17 and 18 for achieving a temperature of about 60° C. to about 90° C. Thus, the binder component contained in the substrate 20 becomes soft, so that the transferring is improved. Even if some of the electroconductive paste P remains on the surface of the intaglio plate 1 after the electroconductive paste P is filled into the pattern groove 2 and scraped off by the squeegee 6, the remaining electroconductive paste P is not transferred to the substrate 20, although it is transferred to the carrier sheet 8. This is because the remaining electroconductive paste P has a small thickness. Accordingly, a fine electroconductive pattern can be formed on the surface of the substrate 20. Moreover, the transferring is more effectively carried out if the transferring rollers 17 and 18 use a rubber having a relatively high hardness.

The carrier sheet 8 is recovered onto a take-up roller 21. The substrate 20 is recovered onto a take-up roller 22. Thereafter, a predetermined number of sheets of the substrate 20 having the transferred electroconductive paste P are laminated and conveyed into a firing oven (not shown) where the substrate 20 is fired together with the paste P. Thereby, the metallic powder contained in the electroconductive paste P is melted so that a thick-film wiring is formed, and also, the substrate 20 is converted to a ceramic substrate. The intaglio plate 1, the substrate 20, and the carrier sheet 8 are not restricted to continuous belt-shaped sheets and may be plural sheets.

After the firing, the laminated ceramic substrate is cut into pieces, and electrodes are formed on the ends of the respective pieces. Thus, a laminated electronic component is produced.

Referring to the second transferring step, the intaglio plate 1, the carrier sheet 8, the carrier sheet 8, and the substrate 20 are provided with alignment marks and are positioned in compliance with the alignment marks, followed by the transferring.

EXAMPLE 2

Figure 2:
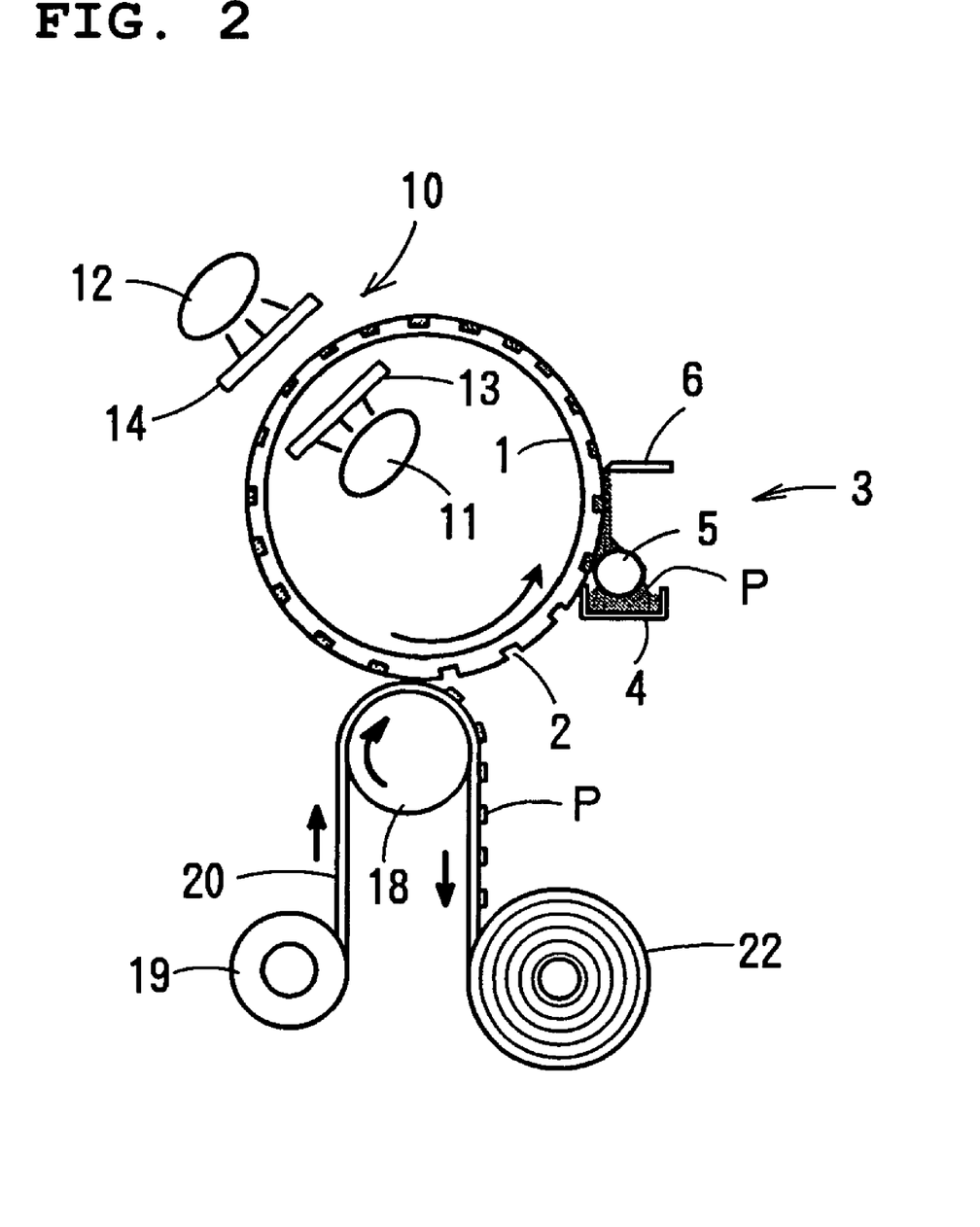
FIG. 2 illustrates a second transfer apparatus for use in a preferred embodiment of the present invention.

FIG. 2 illustrates a second transfer apparatus which carries out a method according to preferred embodiments of the present invention.

In this Example, the electroconductive paste P is transferred directly from the intaglio plate 1 to the substrate 20, not using the carrier sheet 8 as an intermediate piece. The components of Example 2 which are the same as or equivalent to those of the Example 1 are designated by the same reference numerals, and the description is not repeated.

The electroconductive paste P is filled into the pattern groove 2 by the feeding unit 3. The electroconductive paste P is irradiated by UV rays from the light source 11 and 12 arranged on the front and back sides (inner and outer sides) of the intaglio plate 1. When UV rays are irradiated from the front and back sides of the intaglio plate 1, a part of the electroconductive paste P exposed on the surface of the intaglio plate 1 is directly irradiated by the UV rays. A part of the electroconductive paste P which is in contact with the groove 2 of the intaglio plate 1 is irradiated by UV rays via the intaglio plate 1. As a result, the overall surface of the electroconductive paste P is hardened to have a predetermined hardness (dried). Thus, the cohesive force is enhanced.

Subsequently, the electroconductive paste hardened in the groove of the intaglio plate 1 is transferred to the substrate 20. In this case, the substrate 20 is a ceramic green sheet lined with a carrier film and is continuously supplied from the feeding roller 19. The substrate 20 is pressed against the intaglio plate 1 by the transfer roller 18. Thus, the electroconductive paste P is transferred from the intaglio plate 1 to the substrate 20. Also, to improve the transferring-property of the electroconductive paste P, a compression load of about 200 kg/cm² to about 500 kg/cm² may be applied, and a heater may be disposed inside the transfer roller 18.

EXAMPLE 3

Figure 3:
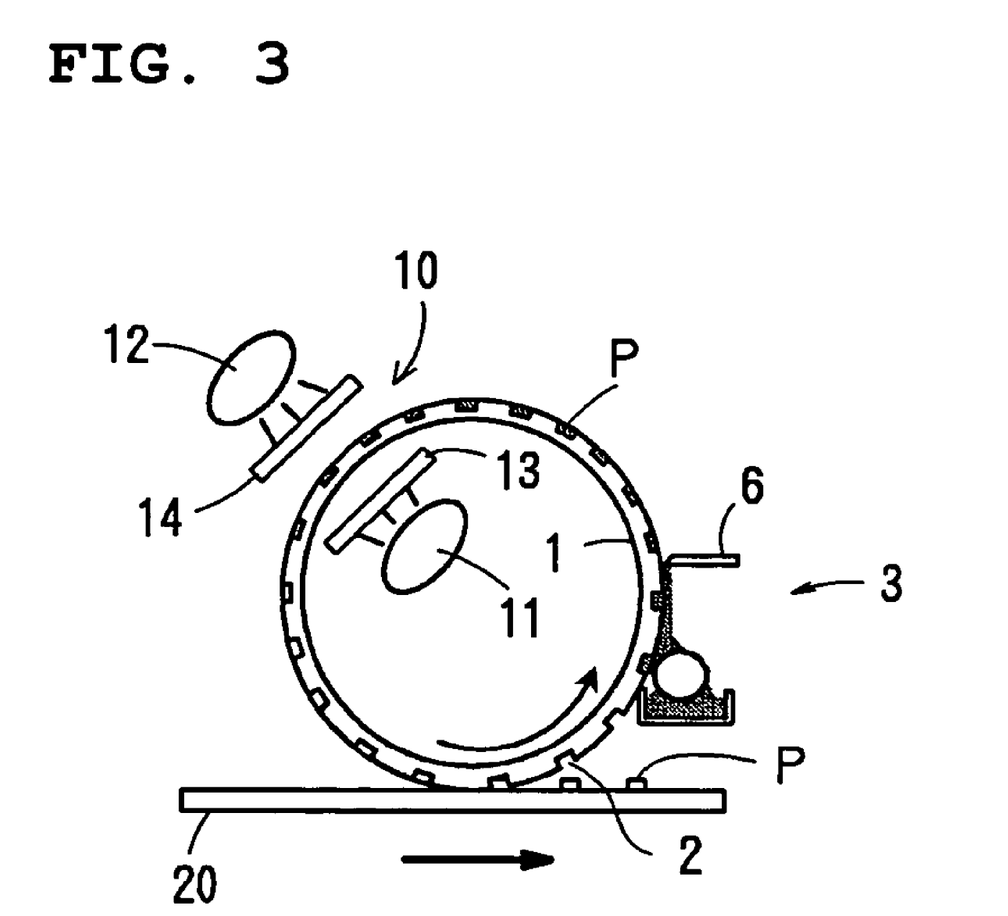
FIG. 3 illustrates a third transfer apparatus for use in a preferred embodiment of the present invention.

FIG. 3 illustrates a third transfer unit which carries out a method according to preferred embodiments of the present invention.

In this example, the electroconductive paste P is transferred directly to the substrate 20 not using the intermediate piece. Moreover, as the substrate 20, a hard substrate such as a fired ceramic plate is used.

The electroconductive paste P filled in the pattern groove 2 and hardened to have a predetermined hardness by UV lamps 11 and 12, which are arranged on the front and back sides (from the inner and outer sides) of the intaglio plate 1, is directly transferred to the substrate 20 which is being moved horizontally in contact with the lower end surface of the intaglio plate 1.

In this case, the entire periphery of the electroconductive paste P filled in the pattern groove 2 is hardened (dried). Thus, the cohesive force of the electroconductive paste P is increased, and the transferring-property of the paste to be transferred to the substrate 20 is greatly improved.

EXAMPLE 4

Figure 4:
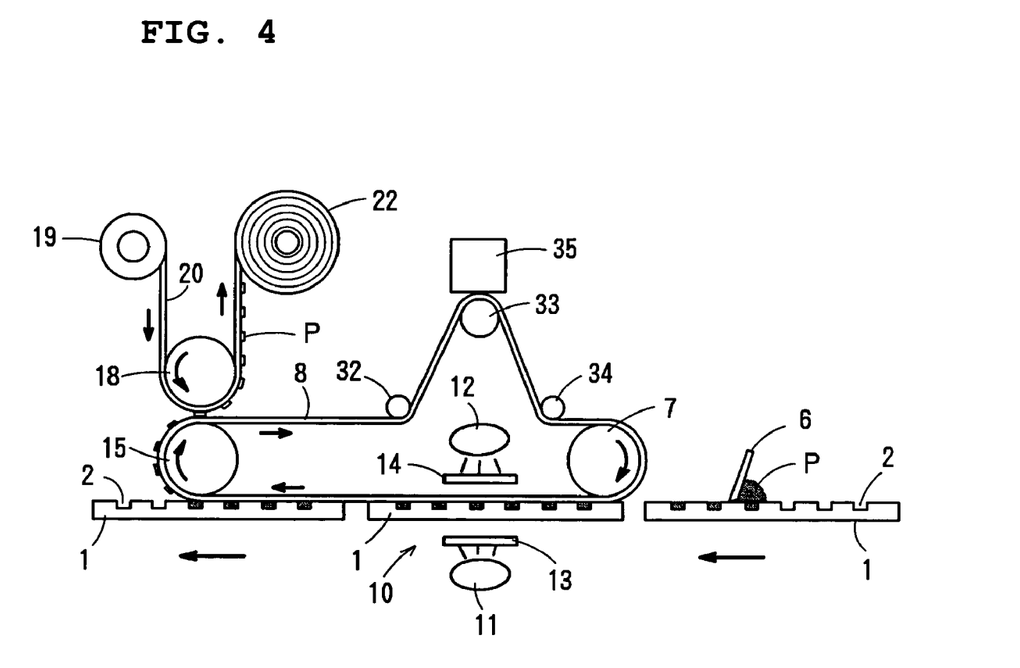
FIG. 4 illustrates a fourth transfer apparatus for use in a preferred embodiment of the present invention.

FIG. 4 illustrates a fourth transfer unit which carries out a method according to preferred embodiments of the present invention.

In the Example 4, a flat-shaped intaglio plate 30 is preferably used. The components which are the same as or equivalent to those of the Example 1 are designated by the same reference numerals, and the description is not repeated.

The intaglio plate 1 is preferably a hard flat plate made of transparent glass or other suitable material and has the pattern groove 2 formed on the surface thereof. The depth of the pattern groove 2 is preferably at least about 20 μm, and the aspect ratio (longitudinal/transverse) is preferably about 1. The electroconductive paste P is applied to the intaglio plate 1, and the excess electroconductive paste P is scraped off by the squeegee 6. Thus, the electroconductive paste P is filled into the pattern groove 2.

The intaglio plate 1 having the electroconductive paste P filled therein contacts the carrier sheet 8, at the position where the first roller 7 is disposed. The carrier sheet 8 is turned around so as to move over the first roller 7, under a guide roller 32, over a guide roller 33, under a guide roller 34, and over the second roller 15 in the direction shown by the arrows in FIG. 4. A cleaning device 35 for removing electroconductive past P remaining on the surface of the carrier sheet 8 is provided near the guide roller 33. Even if a part of the electroconductive paste P remains on the surface of the intaglio plate 1 when the electroconductive paste P is filled in the pattern groove 2 by the squeegee 6, the stains are removed by the cleaning device 35. Thus, the carrier sheet 8 can be repeatedly used.

The intaglio plate 1 and the carrier sheet 8 are moved in the horizontal direction in the state in which they contact each other and are passed through the exposure unit 10, where the electroconductive paste P is hardened until the overall surface of the electroconductive paste P is hardened to a predetermined hardness. In the exposure unit 10, the light source 11 for irradiating UV rays from the lower side of the intaglio plate 1, the light source 12 for irradiating UV rays from the upper side of the carrier sheet 8, the filters 13 and 14 are arranged.

The intaglio plate 1 and the carrier sheet 8, passed through the exposure unit 10, are released from each other by the second roller 15. A bonding force is developed between the electroconductive paste P filled in the pattern groove 2 of the intaglio plate 1 and the carrier sheet 8 contacting the intaglio plate 1, which is caused by the hardening-reaction of the electroconductive paste P. Thus, the electroconductive paste P can be securely transferred to the carrier sheet 8. Also, to improve the transferring from the intaglio plate 1 to the carrier sheet 8, the quantity of UV rays (exposure) irradiated from the upper side of the carrier sheet 8 is preferably larger than the quantity of UV rays irradiated from the lower side of the intaglio plate 1.

The second roller 15 also functions as a transfer roller. The substrate 20 and the carrier sheet 8 are pressed into contact with each other between the second roller 15 and a transfer roller 18. Thus, the electroconductive paste P is re-transferred to the substrate 20. The substrate 20 is preferably a ceramic green sheet lined with a carrier film. To improve the transferring of the electroconductive paste P from the carrier sheet 8 to the substrate 20, a compression load of about 200 kg/cm$^2$ to about 500 kg/cm$^2$ may be applied. Also, heaters may be provided inside the transfer rollers 15 and 18.

EXAMPLE 5

Figure 5:
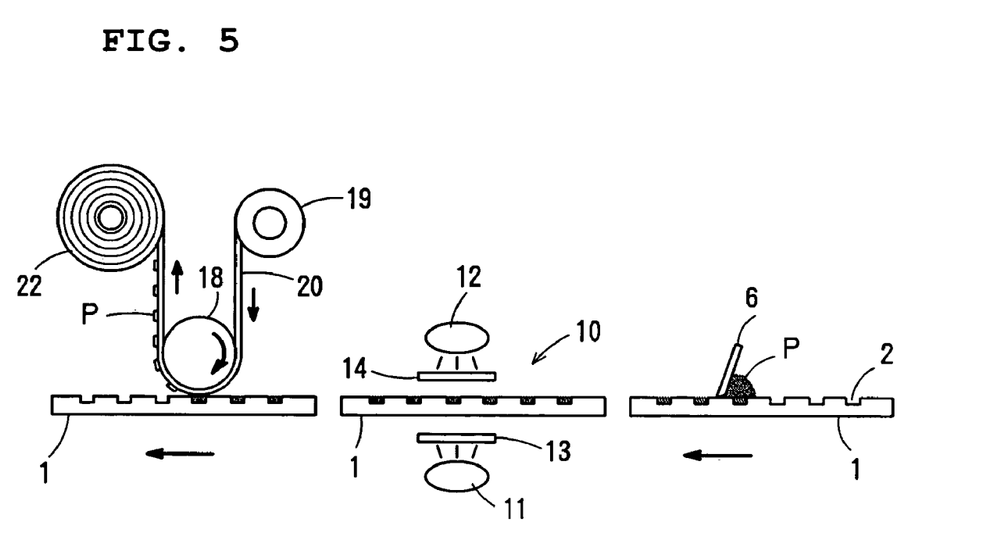
FIG. 5 illustrates a fifth transfer apparatus for use in a preferred embodiment of the present invention.

FIG. 5 illustrates a fifth transferring unit which carries out a method according to preferred embodiments of the present invention.

In this example, the electroconductive paste P is transferred directly from the intaglio plate 1 to the substrate 20, without using the carrier sheet 8 as an intermediate piece. The components of the Example 5 which are the same as or equivalent to those of the Example 4 are designated by the same reference numerals, and the description is not repeated.

The electroconductive paste P is filled into the pattern groove 2 of the intaglio plate 1 by the feeding unit 3. The electroconductive paste P is irradiated with UV rays from the light sources 11 and 12 arranged on the front and back sides of the intaglio plate 1. When UV rays are irradiated from the front and back sides of the intaglio plate 1, a part of the electroconductive paste P exposed on the surface of the intaglio plate 1 is directly irradiated by the UV rays. A part of the electroconductive paste P in contact with the groove of the intaglio plate 1 is irradiated by UV rays which are transmitted through the intaglio plate 1. The whole surface of the electroconductive paste P is hardened (dried) to have a predetermined hardness. Thus, the cohesive force of the electroconductive paste P is enhanced.

The quantity of UV rays irradiated from the front side (from the upper side) of the intaglio plate 1 is preferably larger than the quantity of UV rays irradiated from the back side (from the lower side) of the intaglio plate 1. Thus, the tacky adhesive property or adhesive property of a part of the electroconductive paste P exposed to the surface of the pattern groove 2 can be enhanced, and the cohesive force of the electroconductive paste P can be increased.

After the hardening of the electroconductive paste P is completed, the intaglio plate 1 is passed under the transfer roller 18. Thus, the electroconductive paste P hardened in the pattern groove 2 of the intaglio plate 1 is transferred to the substrate 20. A ceramic green sheet lined with a carrier film is preferably used as the substrate 20. The substrate 20 is continuously supplied from a feeding roller 19 and is pressed against the intaglio plate 1 by the transfer roller 18. Thus, the electroconductive paste P is transferred from the intaglio plate 1 to the substrate 20. To improve the transferring of the electroconductive paste P, a compression load in the range of about 200 kg/cm$^2$ to about 500 kg/cm$^2$ is preferably applied. Moreover, heaters or the like may be provided inside the transferring roller 18.

In the examples 1 to 5, the intaglio plate 1 is preferably made of a hard material such as transparent glass or suitable transparent material. The intaglio plate 1 is preferably formed of a transparent resin film made of PET, PC, or other suitable material, and the pattern groove 2 is preferably formed by laser beam processing. The intaglio plate 1 is bonded to the outer surface of a transparent support 40 made of a hard material such as transparent glass or the like, as shown in FIGS. 6A and 6B.

Figure 6A:
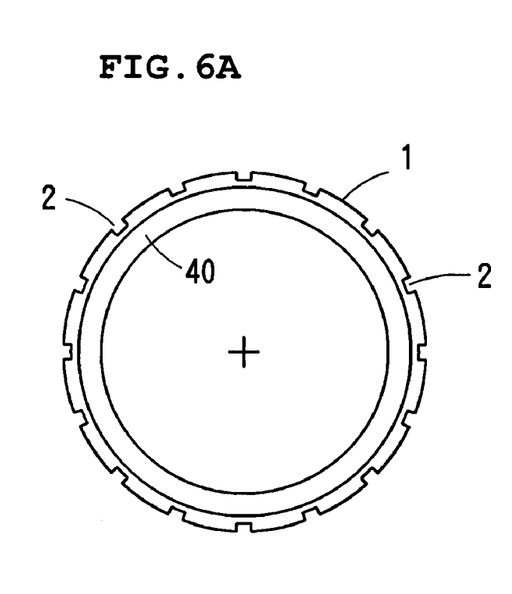
FIGS. 6A and 6B are side-views of an intaglio plate used in a preferred embodiment of the present invention.
Figure 6B:
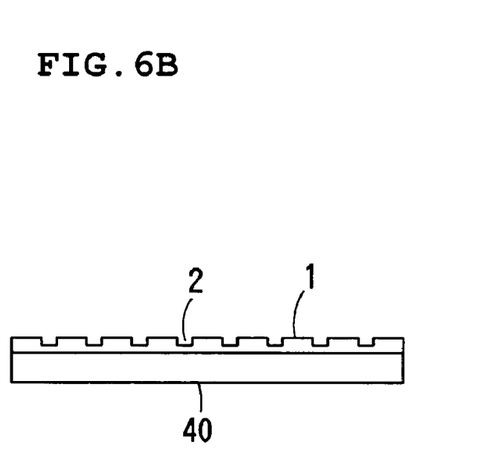

FIG. 6A illustrates the intaglio plate 1 having a drum-shape. FIG. 6B illustrates the intaglio plate 1 having a flat plate shape.

Both of the intaglio plate 1 and the support 40 are preferably UV-transmissive. Thus, the whole surface of the electroconductive paste P filled in the pattern groove 2 can be hardened by irradiation of UV rays from the inner side of the support 40 and from the outer side of the intaglio plate 1. The intaglio plate 1 is preferably formed by laser-beam processing a flexible resin film. Thus, the processing is easily performed. Moreover, the support 40 prevents the intaglio plate 1 from being distorted. Accordingly, when the electroconductive paste P is transferred from the intaglio plate 1 to the carrier sheet 8 or when the electroconductive paste P is transferred from the intaglio plate 1 to the substrate 20, the intaglio plate 1 is prevented from being distorted. Thus, advantageously, the distortion of the pattern and the degradation of the intaglio plate 1 are prevented.

In the above-described examples, the electroconductive paste P which can be hardened by irradiation of UV-rays is described. Electroconductive paste which can be hardened by irradiation of visible rays or infrared rays may be used.

Moreover, the intaglio plate 1 may be made only of a transparent resin material such as a PET film or suitable material.

Referring to a method of enhancing the transfer-property of the electroconductive paste, the quantity of light irradiated from the front side of the intaglio plate is preferably larger than the quantity of light irradiated from the back side.

A fluororesin or suitable material as a release agent is preferably coated on the surface of the intaglio plate in advance, or a tacky-adhesive or an adhesive may be coated on the surface of a substrate (or an intermediate piece) in advance.

Figure 7A:
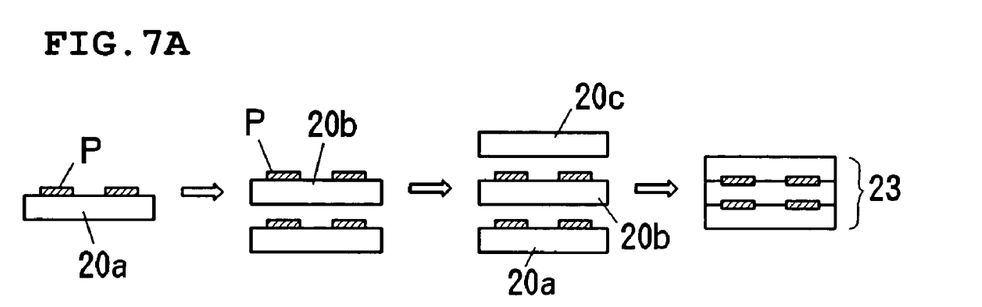
FIGS. 7A and 7B are flow diagrams for producing a laminate according to a preferred embodiment of the present invention.
Figure 7B:
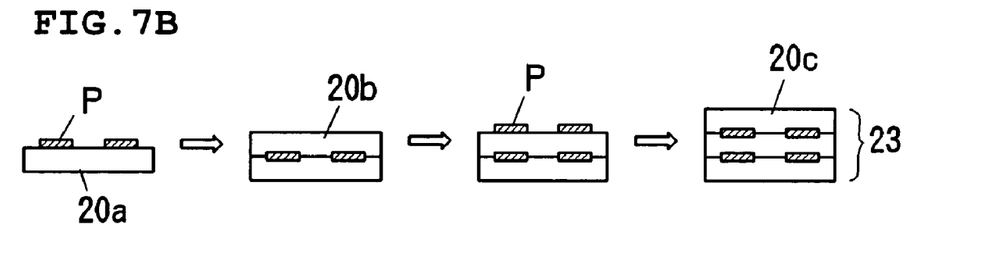

Referring to a method of forming a laminate using a method according to preferred embodiments of the present invention, such a method as shown in FIGS. 7 and 7B may be used.

Referring to FIG. 7A, a substrate 20a having the electroconductive paste P transferred thereto is prepared. Another substrate 20b having the electroconductive paste P transferred thereto is arranged on the above-described substrate 20a. As the uppermost layer, a substrate 20 not having the electroconductive paste P transferred thereto is arranged. Simultaneously, the substrates are laminated to produce a laminate 23. Referring to FIG. 7B, the electroconductive paste P is transferred to the substrate 20a, the substrate 20b not having the electroconductive paste P transferred thereto is laminated, and the electroconductive paste P is laminated on the formed laminate. These processes are repeated. Thereafter, the substrate 20c not having the electroconductive paste P transferred thereto is laminated as the uppermost layer. Thus, a laminate 23 is produced.

Thereafter, the laminate 23 and the electroconductive paste P are simultaneously fired. A laminate having a three-layer structure is described. However, a laminate having an at least four layer structure may be used.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method of forming a thick-film wiring on a substrate comprising:
    a first step of filling a photosensitive-electroconductive paste into a pattern groove formed on the surface of a light-transmissive plate, the pattern groove corresponding to a desired thick-film wiring pattern;
    a second step of irradiating the photosensitive-electroconductive paste filled in the pattern groove with light-rays from the front and back sides of the plate to cause the photosensitive-electroconductive paste to harden until the peripheral surface of the electroconductive paste has a predetermined hardness;
    a third step of transferring the photosensitive-electroconductive paste hardened in the plate directly to the substrate or via an intermediate piece to the substrate; and
    a fourth step of firing the photosensitive-electroconductive paste, whereby the thick-film wiring is formed on the substrate; wherein
    the plate is made of a transparent polyethyleneterephthalate film.

2. A method of forming a thick-film wiring according to claim 1, wherein in the second step, light having a wavelength of at least about 350 nm irradiates the photosensitive-electroconductive paste from the front and back sides of the plate.

3. A method of forming a thick-film wiring according to claim 1, wherein the pattern groove of the plate is processed with a laser beam having a wavelength shorter than the wavelength of the light used in the second step, and the plate has a transmittance spectrum which is lower than that for the laser beam and which is higher than the light used in the second step.

4. A method of forming a thick-film wiring according to claim 1, wherein the intermediate piece is made of a light-transmissive material;
    the second step includes irradiating light from the back side of the plate and from the back side of the intermediate piece while the intermediate piece and the plate overlap each other; and
    the third step includes transferring the photosensitive-electroconductive paste hardened in the plate to the intermediate piece, and then, transferring the photosensitive-electroconductive paste from the intermediate piece to the substrate.

5. A method of forming a thick-film wiring according to claim 1, wherein, in the second step, the quantity of light irradiated from the front side of the plate is larger than the quantity of light irradiated from the back side of the plate.

6. A method of forming a thick-film wiring according to claim 1, wherein the plate is a flexible plate made of resin, and the resin plate is bonded to a support which is light-transmissive and non-flexible.

7. A method of forming a thick-film wiring according to claim 1, wherein a release agent is coated on an inner surface of the pattern groove of the plate.

8. A method of forming a thick-film wiring according to claim 1, wherein the plate is an intaglio plate.

9. A method of forming a thick-film wiring according to claim 1, wherein a surface of the plate is coated with a release agent.

10. A method of forming a thick-film wiring according to claim 1, wherein a cross-sectional shape of the pattern groove is a trapezoid having side walls with a predetermined tapering-angle.

11. A method of forming a thick-film wiring according to claim 1, wherein a surface of the substrate is coated with an adhesive.

12. A method of forming a thick-film wiring according to claim 1, wherein the plate is made of glass.

13. A method of forming a thick-film wiring according to claim 9, wherein the release agent is a fluororesin.

14. A method of producing a laminated electronic component comprising the steps of:
    preparing a substrate made of a green sheet;
    transferring photosensitive-electroconductive paste onto the substrate directly or via an intermediate piece;
    repeating the steps of preparing and transferring to form a laminate of plural substrates having the photosensitive-electroconductive paste transferred thereto; and
    firing the laminate; wherein
    the photosensitive-electroconductive paste is formed by a method of forming a thick-film wiring comprising:
        a first step of filling the photosensitive-electroconductive paste into a pattern groove formed on the surface of a light-transmissive plate, the pattern groove corresponding to a desired thick-film wiring pattern;
        a second step of irradiating the photosensitive-electroconductive paste filled in the pattern groove with light-rays from the front and back sides of the plate to cause the photosensitive-electroconductive paste to harden until the peripheral surface of the electroconductive paste has a predetermined hardness;
        a third step of transferring the photosensitive-electroconductive paste hardened in the plate directly to the substrate or via an intermediate piece to the substrate; and a fourth step of firing the photosensitive-electroconductive paste, whereby the thick-film wiring is formed on the substrate; wherein the plate is made of a transparent polyethyleneterephthalate film.

15. A method of forming a thick-film wiring according to claim 14, wherein the pattern groove of the plate is processed with a laser beam having a wavelength shorter than the wavelength of the light used in the second step; and the plate has a transmittance spectrum which is lower than the laser beam and which is higher than the light used in the second step.

16. A method of forming a thick-film wiring according to claim 14, wherein the intermediate piece is made of a light-transmitting material;

the second step includes irradiating light from the back side of the plate and from the back side of the intermediate piece while the intermediate piece and the plate overlap each other; and the third step includes transferring the photosensitive-electroconductive paste hardened in the plate to the intermediate piece, and then, transferring the photosensitive-electroconductive paste from the intermediate piece to the substrate.

17. A method of forming a thick-film wiring according to claim 14, wherein, in the second step, the quantity of light irradiated from the front side of the plate is larger than the quantity of light irradiated from the back side of the plate.

18. A method of forming a thick-film wiring according to claim 14, wherein the plate is a flexible plate made of resin, and the resin plate is bonded to a support which is light-transmitting and non-flexible.

19. A method of forming a thick-film wiring according to claim 14, wherein a release agent is coated on an inner surface of the pattern groove of the plate.

* * * * *